(12) United States Patent
Teichmann et al.

(10) Patent No.: US 10,730,754 B2
(45) Date of Patent: Aug. 4, 2020

(54) TRIPHENYLGERMYLSILANE AND TRICHLOROSILYL-TRICHLOROGERMANE FOR THE PRODUCTION OF GERMANIUM-SILICON LAYERS, AND METHOD FOR THE PRODUCTION THEREOF FROM TRICHLOROSILYL-TRIPHENYLGERMANE

(71) Applicant: Evonik Operations GmbH, Essen (DE)

(72) Inventors: Julian Teichmann, Frankfurt am Main (DE); Matthias Wagner, Niddatal (DE); Hans-Wolfram Lerner, Oberursel (DE)

(73) Assignee: Evonik Operations GmbH, Essen (DE)

( * ) Notice: Subject to any disclaimer, the term of this patent is extended or adjusted under 35 U.S.C. 154(b) by 0 days.

(21) Appl. No.: 16/618,196

(22) PCT Filed: May 23, 2018

(86) PCT No.: PCT/EP2018/063563
§ 371 (c)(1),
(2) Date: Nov. 29, 2019

(87) PCT Pub. No.: WO2018/219753
PCT Pub. Date: Dec. 6, 2018

(65) Prior Publication Data
US 2020/0180966 A1    Jun. 11, 2020

(30) Foreign Application Priority Data
Jun. 1, 2017   (EP) ..................................... 17173951

(51) Int. Cl.
C07F 7/30   (2006.01)
C01B 33/04  (2006.01)
(52) U.S. Cl.
CPC .............. C01B 33/046 (2013.01); C07F 7/30 (2013.01)
(58) Field of Classification Search
CPC ...................................................... C07F 7/30
See application file for complete search history.

(56) References Cited

U.S. PATENT DOCUMENTS 7,540,920 B2   6/2009 Singh et al.
8,722,913 B2 * 5/2014 Lang ................... C01B 21/0823
                                                          556/430
9,550,163 B2 * 1/2017 Lang ...................... C01B 32/907
10,414,783 B2 * 9/2019 Teichmann ................ C07F 7/30
10,618,921 B2 * 4/2020 Teichmann ........... C07F 19/005
2010/0080746 A1 * 4/2010 Lang ......................... C01B 33/04
                                                          423/325
2014/0193321 A1 * 7/2014 Lang .................... C01B 21/0823
                                                          423/342
2015/0258522 A1 * 9/2015 Lang ....................... C01B 33/04
                                                          422/186.18
2018/0346494 A1 * 12/2018 Teichmann ....... H01L 21/02532
2018/0346495 A1 * 12/2018 Teichmann ........... C07F 19/005
2020/0165278 A1 * 5/2020 Teichmann ............. C07F 7/025

FOREIGN PATENT DOCUMENTS

WO       2004/036631       4/2004

OTHER PUBLICATIONS

F. Feher et al., 51 Tetrahedron Letters, 4443-4447 (1970) (Year: 1970).*
CAS Abstract of F. Feher et al., 51 Tetrahedron Letters, 4443-4447 (1970) (Year: 1970).*
U.S. Appl. No. 15/994,304, filed May 31, 2018, 2018/0346495, Teichmann et al.
European Search Report dated Oct. 2, 2017 in European Application No. 17173951.9.
International Search Report dated Jul. 27, 2018 in PCT/EP2018/063563, with English translation.
Written Opinion dated Jul. 27, 2018 in PCT/EP2018/063563, with English translation.
Feher et al., Tetrahedron Letters No. 51, pp. 4443-4447, 1970.
Kawachi et al., Journal of Organometallic Chemistry 590 (1999) 15-24.
Müller et al., Journal of Organometallic Chemistry 579 (1999) 156-163.
Ritter et al., J. Am. Chem. Soc. 2005, 127, 9855-9864.
Sih et al, Angew. Chem., 1993, 105, Nr. 4, pp. 587-588.
Stueger et al., Inorg. Chem. 2016, 55, 4034-4038.
Tice et al., Inorg. Chem. 2009, 48, 6314-6320.

* cited by examiner

Primary Examiner — Alexander R Pagano
(74) Attorney, Agent, or Firm — Grüneberg and Myers PLLC

(57) ABSTRACT

Triphenylgermylsilane ($Ph_3Ge$—$SiH_3$) is useful for the production of germanium-silicon layers (Ge—Si) or as transfer agent of silane groups ($SiH_3$). Further, a method describes the production of triphenylgermylsilane ($Ph_3Ge$—$SiH_3$) by reducing trichlorosilyl-triphenylgermane ($Ph_3Ge$—$SiCl_3$) with a hydride in solution, and another method describes the production of trichlorosilyltrichlorogermane ($Cl_3Ge$—$SiCl_3$) by reacting trichlorosilyltriphenyigermane ($Ph_3Ge$—$SiCl_3$) with hydrogen chloride (HCl) in the presence of $AlCl_3$ in solution. In addition, trichlorosilyltrichlorogermane is also used for the production of germanium-silicon layers (Ge—Si).

17 Claims, 3 Drawing Sheets

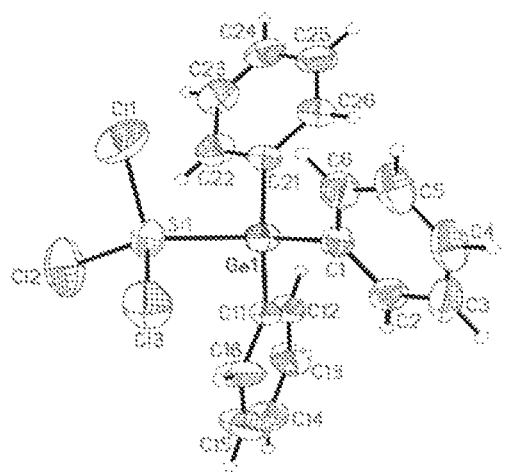
Fig. 1a: Crystal structure of *1*.
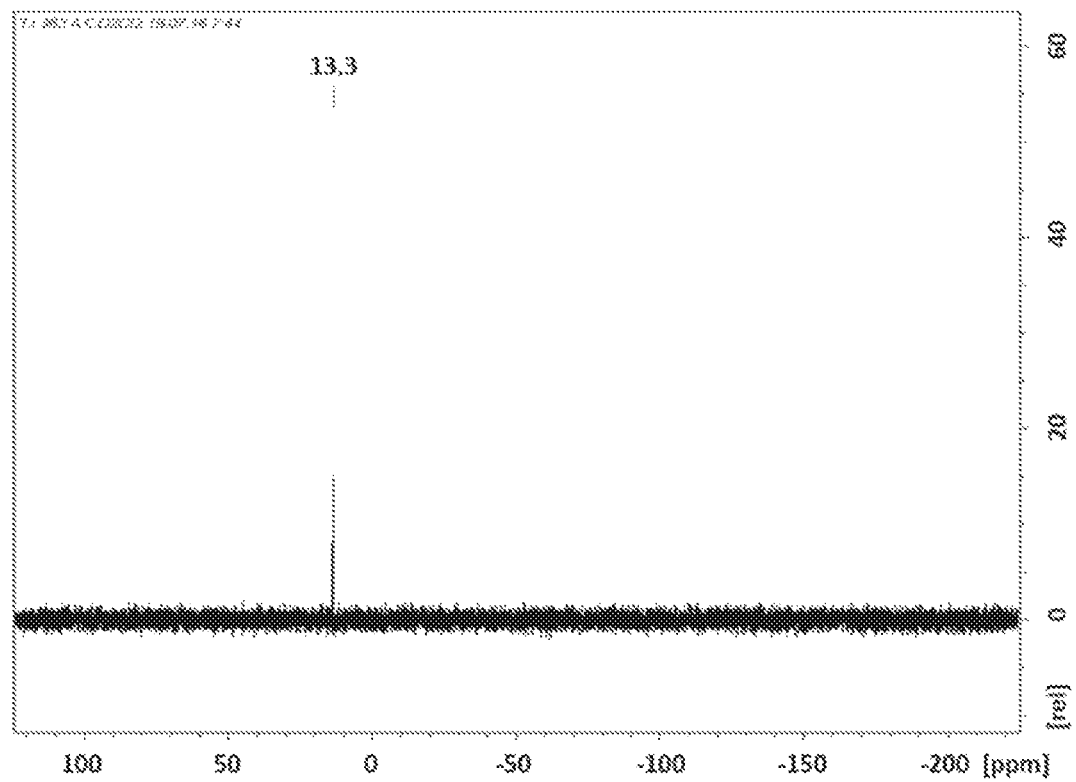
Fig. 1b: ²⁹Si NMR spectrum of the crude product of the synthesis of *1*.

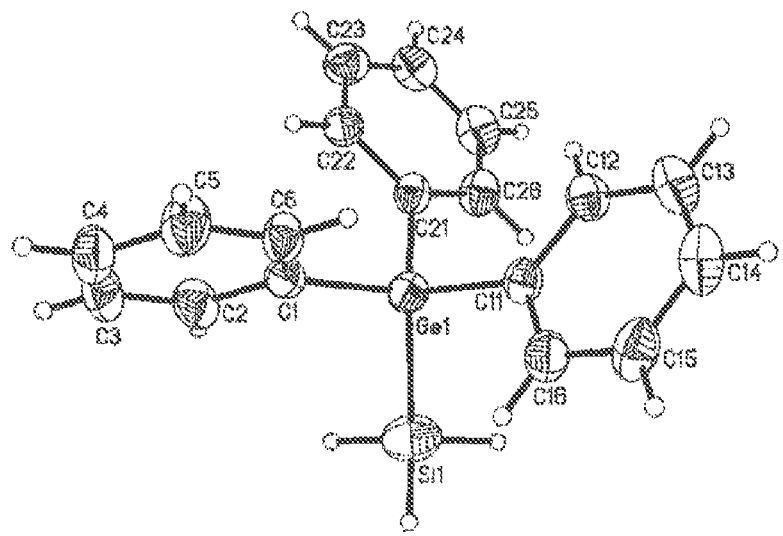
Fig. 2a: Crystal structure of 2.
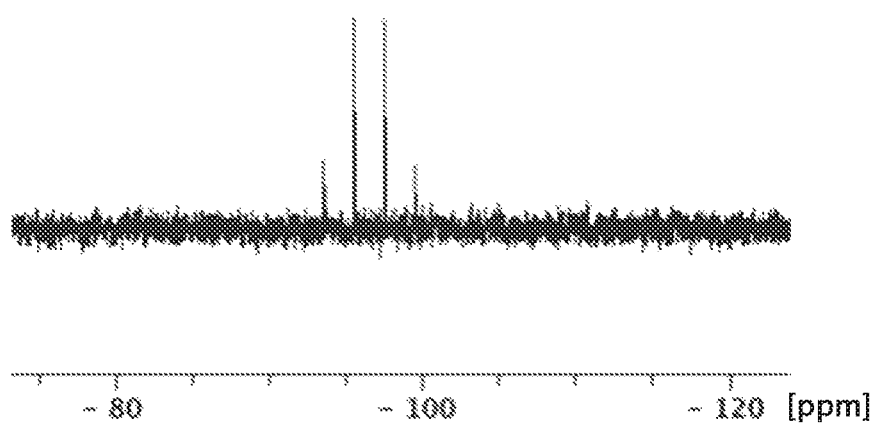
Fig. 2b: Detail from the $^{29}$Si NMR spectrum of the reaction solution from the synthesis of 2.

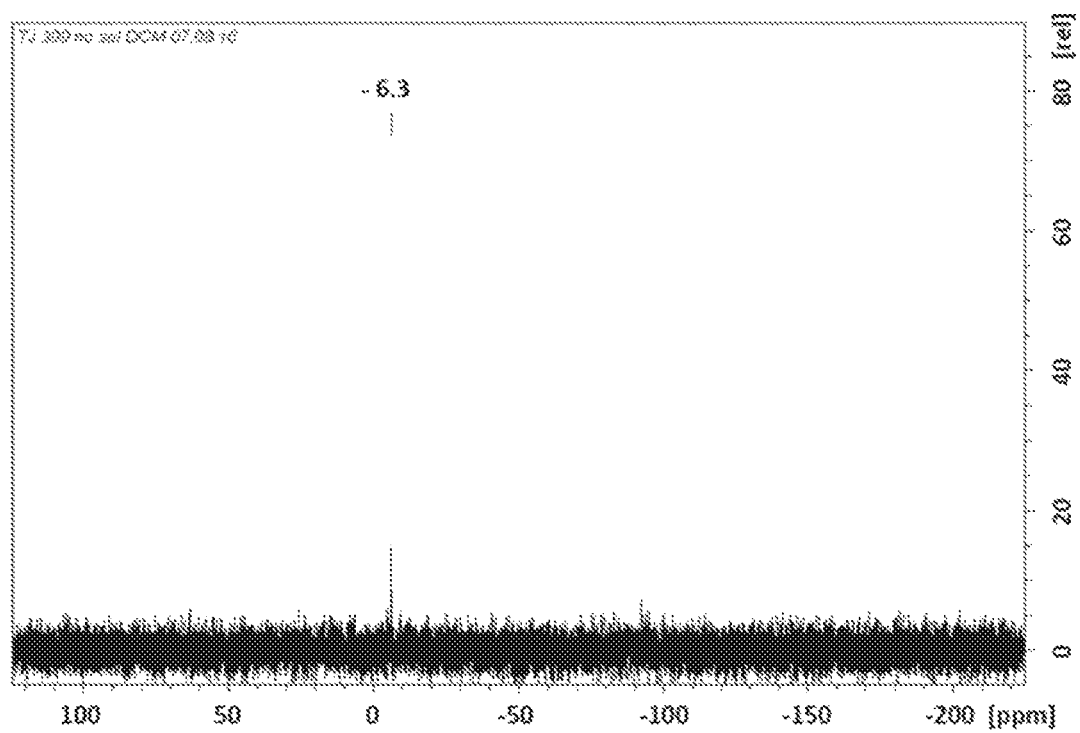
Fig. 3a: $^{29}$Si NMR spectrum of the reaction solution from the synthesis of 3.

TRIPHENYLGERMYLSILANE AND TRICHLOROSILYL-TRICHLOROGERMANE FOR THE PRODUCTION OF GERMANIUM-SILICON LAYERS, AND METHOD FOR THE PRODUCTION THEREOF FROM TRICHLOROSILYL-TRIPHENYLGERMANE

CROSS-REFERENCE TO RELATED APPLICATIONS

This application is a National Stage entry under §371 of International Application No. PCT/EP2018/063563, filed on May 23, 2018, and which claims the benefit of European Application No. 17173951.9, filed on Jun. 1, 2017.

BACKGROUND OF THE INVENTION

Field of the Invention

The present invention relates to the novel compound triphenylgermylsilane, to a process for preparation thereof and to the use thereof.

Discussion of the Background

Halosilanes, polyhalosilanes, halogermanes, polyhalogermanes, silane, polysilanes, germane, polygermanes and corresponding mixed compounds have long been known; cf., in addition to the standard inorganic chemistry textbooks, also WO 2004/036631 A2 or C. J. Ritter et al., J. Am. Chem. Soc., 2005, 127, 9855-9864, L. Müller et al. in J. Organomet. Chem., 1999, 579, 156-163 describe, inter glia, the preparation of trichlorosilylmethylgermanes.

Angew. Chem., 1993, 105, 587-588 (G. Sih et al,) and Tetrahedron Lett., 1970, 51, 4443-4447 (F. Feher et al.) disclose methylgermylsilanes and various phenylgermylsilanes, the preparation of the latter compounds being difficult and complex.

Also known are phenyl- and hydrogen-containing compounds in which Sn—Si and Sn—Ge bonds are present (J. B. Tice et al., J. Inorganic Chemistry, 2009, 48(13), 6314-6320). It is suggested here that these compounds be used as IR semiconductors.

Singh et al, in patent specification U.S. Pat. No. 7,540,920 B2 disclose Si—Ge compounds of the formula $X_1X_2X_3$—Si—Ge—X4X5X6 having hydrogen or halogen radicals $X_{1-6}$.

Nothing is known to date about triphenylgermylsilanes. For the purposes of fundamental research, the aim is thus to discover this compound as well and to find suitable preparation routes of maximum simplicity.

The problem addressed by the present invention was that of preparing triphenylgermylsilanes and of providing them as such.

SUMMARY OF THE INVENTION

The problem is solved according to embodiments disclosed herein.

It has been found that, surprisingly, triphenylgermylsilanes are obtained when trichlorosilyltriphenylgermane is dissolved in a solvent, preferably in diethyl ether, and reduced with addition of a hydride, more preferably with lithium aluminium hydride used in an equal molar amount, preferably in a dry apparatus, further preferably under protective gas, for example nitrogen, and preferably while mixing, is left to react at a temperature of 5° C. to 30° C., more preferably at room temperature 20° C., RT for short, and over a duration of 1 to 24 hours, preferably over the course of 12 h, then the solids component obtained is separated from the solution, suitably by filtration or by means of a centrifuge, the solvent is suitably removed gradually via the gas phase, in order to achieve good crystallization of the product, preferably under reduced pressure and optionally with reduction of the temperature, and the triphenylgermylsilane formed in the reduction is obtained as a crystalline solid.

The present invention thus provides the novel compound triphenylgermylsilane ($Ph_3Ge$—$SiH_3$).

The invention likewise provides a process for preparing triphenylgermylsilane, by dissolving trichlorosilyltriphenylgermane in a solvent and reducing it with addition of a hydride to obtain a product solution.

BRIEF DESCRIPTION OF DRAWINGS

FIG. 1a is an example of a crystal structure of colourless crystalline solid $Ph_3Ge$—$SiCl_3$.

FIG. 1b is an example of a $^{29}Si$ NMR spectrum of the crude product of the synthesis of the colourless crystalline solid $Ph_3Ge$—$SiCl_3$.

FIG. 2a is an example of a crystal structure of $Ph_3Ge$—$SiH_3$.

FIG. 2b is an example of detail from the $^{29}Si$ NMR spectrum of the reaction solution from the synthesis of $Ph_3Ge$—$SiH_3$.

FIG. 3a is an example of $^{29}Si$ NMR spectrum of the reaction solution from the synthesis of $Cl_3Si$—$GeCl_3$.

DETAILED DESCRIPTION OF THE INVENTION

The invention is elucidated in detail hereinafter.

Preferably, in the process according to the invention, the solvent used is diethyl ether, in which the trichlorosilyltriphenylgermane is dissolved.

It may also be advantageous to use preferably lithium aluminium hydride or diisobutylaluminium hydride as hydride in the process. The conversion reaction is accelerated when the hydride is used with mixing.

In addition, a ratio of the molar amount of hydride to $Ph_3Ge$—$SiCl_3$ within a range from 2:1 to 1:2 can be selected, preferably a ratio of 1:1.

Advantageously, in the process according to the invention, the mixture of the feedstocks can be left to react at a temperature of 5° C. to 30° C., more preferably at room temperature, over a period of 1 to 24 hours, preferably over 12 h. It may be advantageous to stir the mixture during the time for the reaction, further preferably to stir it under protective gas, for example under nitrogen.

The proportion of solids can then be separated from the product solution obtained by the process and then the solvent can be removed, preferably under reduced pressure, for example within a range from 1 to 500 hPa, and triphenylgermylsilane can be obtained as a crystalline product, advantageously by filtration or centrifugation for example.

The performance of the process according to the invention is advantageous under protective gas, in which case it is possible to use a suitable isolation vessel, for example a glovebox. In addition, it is advantageous to conduct the process under protective gas, preferably under nitrogen or argon. Water or moisture must not be present.

The trichlorosilyltriphenylgermane feedstock used in the process according to the invention is suitably obtained from a reaction of $Ph_3GeCl$ with $Si_2Cl_6$, as also described in the European parallel application entitled "Novel chlorosilylarylgermanes, method for preparation thereof and use thereof".

Using the method according to the invention, the interesting molecule trichlorosilyltrichlorogermane can also be provided, which has already been disclosed by Singh et al, (U.S. Pat. No. 7,540,920 B2) without a method of preparation. For this purpose, the process according to the invention is subjected to a simple modification, namely by dissolving trichlorosilyltriphenylgermane and $AlCl_3$ in a solvent, preferably in dichloromethane and, rather than adding a hydride, conducting a chlorination of the $Cl_3Si$—$GePh_3$. This is accomplished by condensing hydrogen chloride in a stoichiometric amount onto the reaction solution just obtained, preferably onto the dichloromethane solution obtained. In this way, access to the compound $Cl_3Si$—$GeCl_3$ is obtained. A preferred execution of this process is shown by Example B.

The present invention thus also provides a process for preparing trichlorosilyltrichlorogermane, by dissolving trichlorosilyltriphenylgermane and $AlCl_3$ in a solvent, preferably in dichloromethane, to obtain a reaction solution, and then condensing hydrogen chloride onto this reaction solution in a stoichiometric amount, preferably in an amount of 1 to 5 mol HCl per mole of $Cl_3Si$—$GePh_3$, more preferably 3 mol of HCl per mole of $Cl_3Si$—$GePh_3$. It may be advantageous to use $AlCl_3$ in a catalytic amount in this process, preferably in an amount of 0.1 to 3 mol $AlCl_3$ per mole of $Cl_3Si$—$GePh_3$, more preferably of 1 to 2 mol $AlCl_3$ per mole of $Cl_3Si$—$GePh_3$.

The present invention likewise provides for the use of the triphenylgermylsilane according to the invention or prepared in accordance with the invention for the production of Ge—Si layers or as a transferrer of $SiH_3$ groups.

The function of being able to transfer $SiH_3$ groups has been known from the prior art to date from suitable tin compounds.

The invention likewise provides for the use of trichlorosilyltrichlorogermane prepared in accordance with the invention for the production of Si—Ge layers.

The examples which follow provide additional illustration of the present invention without restricting the subject-matter.

In the context of the invention, the measure "equivalent", "eq." for short, is understood to mean the amount of catalyst in mol based on the amount of hexachlorodisilane in mol. For example, 0.1 eq. of catalyst means the amount of 0.1 mol of catalyst per mole of hexachlorodisilane or 10 mol % of catalyst relative to hexachlorodisilane.

Analytical Methods for Determination of the Crystal Structure

The data for all structures were collected at 173 K using a STOE IPDS II dual beam diffractometer with a Genix microfocus tube having mirror optics using $MoK_\alpha$ radiation ($\lambda=0.71073$ Å) and scaled using the frame scaling procedure of the X-AREA program (Stoe & Cie, 2002). The structures were solved by direct methods with the aid of the SHELXS program (Sheldrick, 2008) and refined on $F^2$ by the full matrix least squares technique. Cell parameters were determined by refinement on $\theta$ values of the reflections with $I>6\sigma(I)$.

The x-ray structure analysis of the single crystal obtained is confirmed by the composition of the compound prepared in accordance with the invention as triphenylgermylsilane ($Ph_3Ge$—$SiH_3$), shown in FIG. 2a. In addition, a $^{29}Si$ NMR spectroscopy analysis of the clear product solution was conducted after filtration and before the crystallization, shown in FIG. 2b.

In the figures, the atoms that are not shown are hydrogen.

Feedstocks:

$Ph_3GeCl$, hexachlorodisilane (HODS), dichloromethane.

EXAMPLE A: PREPARATION OF SILYLTRIPHENYLGERMANE (2)

First of all, a synthesis was effected according to Equation 1 from $Ph_3GeCl$ and $Si_2Cl_6$ with addition of a catalytic amount of 0.1 eq. of $[nBu_4N]Cl$.

Equation 1: Reaction of $Ph_3GeCl$ and $Si_2Cl_6$ with addition of the catalytic amount of 0.1 eq. of $[nBu_4N]Cl$.

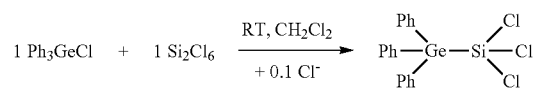

To a clear, colourless solution of 500 mg, corresponding to 1.47 mmol, of $Ph_3GeCl$ and 40 mg or 0.14 mmol of $[nBu_4N]Cl$ in 5 ml of $CH_2Cl_2$ were added while stirring at room temperature 400 mg, corresponding to 1.49 mmol, of $Si_2Cl_6$. A clear colourless reaction solution was obtained which was stirred at room temperature over the course of 12 h. After gradual removal of the solvent, it was possible to isolate 1 from the reaction solution as crude product in the form of a colourless crystalline solid $Ph_3Ge$—$SiCl_3$ (1). The yield was 59%. The crude product still comprised up to about 30% of the reactant $Ph_3GeCl$. By x-ray diffractometry, it was possible to determine the crystal structure of 1, shown in FIG. 1a.

The $^{29}Si$ NMR spectrum of 1 is shown in FIG. 1b.

All results of a $^1H$, $^{13}C$ and $^{29}Si$ NMR spectroscopy analysis:

$^{29}Si$ NMR (99.4 MHz, $CD_2Cl_2$, 298 K):
$\delta=13.3$.
$^1H$ NMR (500.2 MHz, $CD_2Cl_2$, 298 K):
$\delta=7.58$ (m); 7.75 (dd$^3$J(H, H)=8.0 Hz, $^2$J(H, H)=1.4 Hz).
$^{13}C$ NMR (125.0 MHz, $CD_2Cl_2$, 298 K):
$\delta=128.9$; 130.1; 132.2; 135.3.

Subsequently, the $Ph_3Ge$—$SiCl_3$ (1) obtained was reacted according to Equation 2 with $LiAlH_4$ in diethyl ether.

Equation 2: Reaction of 1 and $LiAlH_4$.

To a suspension of 9 mg $LiAlH_4$, corresponding to 0.2 mmol, in $Et_2O$ was added, at room temperature, a clear, colourless solution of 1 in an amount of 100 mg or 0.2 mmol in $Et_2O$. This reaction solution was stirred at room temperature for 12 h.

After removal of the residual $LiAlH_4$ by filtration and gradual removal of the solvent, it was possible to isolate Ph$_3$Ge—SiH$_3$ (2) from the reaction solution as a colourless, crystalline solid in a yield of 76%.

By x-ray diffractometry, it was possible to determine the crystal structure of 2, shown in FIG. 2a.

The $^{29}$Si NMR spectrum of 2 is shown in FIG. 2b, with the ordinate in relative units. All results of a $^1$H, $^{13}$C and $^{29}$Si NMR spectroscopy analysis:

$^{29}$Si NMR (99.4 MHz; c Et$_2$O; 298 K):

δ=q 96.5 $^1$J($^1$H, $^{29}$Si)=197 Hz.

$^1$H NMR (500.2 MHz; undeuterated Et$_2$O; 298 K):

δ=s 4.3 (only 1 $^{29}$Si satellite with coupling constant 98 Hz is apparent. The other is under the Et$_2$O signal); m 8.1; m 8.2.

$^{13}$C NMR (125.0 MHz; undeuterated Et$_2$O; 298 K):

δ=128.9; 129.4; 135.5; 137.2.

EXAMPLE B: PREPARATION OF TRICHLOROSILYLTRICHLOROGERMANE (3)

The chlorination of Cl$_3$Si—GePh$_3$ was effected according to Equation 3. This was done by condensing a stoichiometric amount, namely 3 mmol of HCl per mmol of Cl$_3$Si—GePh$_3$ (2), onto a dichloromethane solution of 2 and AlCl$_3$.

Equation 3: Chlorination of Cl$_3$Si—GePh$_3$ with HCl and catalytic amount of AlCl$_3$.

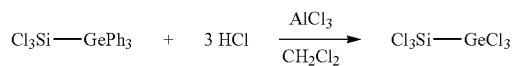

To a clear and colourless solution of 180 mg or 0.41 mmol of 2 in 5 ml of CH$_2$Cl$_2$ were added while stirring at room temperature 100 mg or 0.75 mmol of AlCl$_3$, whereupon the reaction solution turned an intense red. This red reaction solution was cooled with liquid nitrogen to −196.15° C. and then 44.846 g, corresponding to 30.75 ml or 1.23 mmol, of gaseous hydrogen chloride were condensed in.

After 10 minutes, the cooling was removed and the reaction mixture was warmed to room temperature.

A $^{29}$Si NMR spectroscopy analysis of the reaction solution showed the NMR signal of 3 at a chemical shift of −6.3 ppm, shown in FIG. 3a.

All results of a $^{29}$Si NMR spectroscopy analysis:

$^{29}$Si NMR (99.4 MHz; CH$_2$Cl$_2$; 298 K):

δ=−6.3.

The invention claimed is:

1. A triphenylgermylsilane with a formula of Ph$_3$Ge—SiH$_3$.

2. A process for preparing triphenylgermylsilane, the process comprising:
dissolving trichlorosilyltriphenylgermane of formula Ph$_3$Ge—SiCl$_3$ in a solvent, and
reducing the trichlorosilyltriphenylgermane with addition of a hydride to obtain a product solution.

3. The process according to claim 2, wherein the solvent is diethyl ether.

4. The process according to claim 2, wherein the hydride is lithium aluminium hydride.

5. The process according to claim 2, wherein the hydride is used in a molar ratio to the trichlorosilyltriphenylgermane in the range from 2:1 to 1:2.

6. The process according to claim 2, wherein a mixture of feedstocks reacts at a temperature of 5° C. to 30° C. over a period of 1 to 24 hours.

7. The process according to claim 2, further comprising:
separating a proportion of solids from the product solution,
removing the solvent, and
obtaining triphenylgermylsilane as a crystalline product.

8. The process according to claim 2, wherein a trichlorosilyltriphenylgermane feedstock is obtained from a reaction of Ph$_3$GeCl with Si$_2$Cl$_6$.

9. A method for production of GeSi layers, the method comprising:
reacting the compound according to claim 1 to form the GeSi layers.

10. A process for preparing trichlorosilyltrichlorogermane, comprising:
dissolving trichlorosilyltriphenylgermane and AlCl$_3$ (aluminium trichloride) in a solvent to obtain a reaction solution, and
condensing hydrogen chloride onto this reaction solution in a stoichiometric amount.

11. The process according to claim 10, wherein hydrogen chloride is used in an amount of 1 to 5 mol hydrogen chloride per mole of the trichlorosilyltriphenylgermane, and/or
aluminium trichloride is used in an amount of 0.1 to 3 mol of aluminium trichloride per mole of the trichlorosilyltriphenylgermane.

12. A method for production of GeSi layers, the method comprising:
reacting the trichlorosilyltrichlorogermane prepared according to claim 10 to form the GeSi layers.

13. The process according to claim 5, wherein the molar ratio is 1:1.

14. The process according to claim 7, wherein the solvent is removed under reduced pressure in a range from 1 to 500 hPa.

15. A method, comprising:
reacting the triphenylgermylsilane according to claim 1 to transfer SiH$_3$ groups from a first compound to a second compound.

16. The method according to claim 15, wherein the first compound is a tin compound.

17. The process according to claim 11, wherein
hydrogen chloride is used in an amount of 3 mol of hydrogen chloride per mole of trichlorosilyltriphenylgermane, and/or
aluminium trichloride is used in an amount of 1 to 2 mol of aluminium trichloride per mole of trichlorosilyltriphenylgermane.

* * * * *